US006195780B1

(12) United States Patent
Dravida et al.

(10) Patent No.: US 6,195,780 B1
(45) Date of Patent: *Feb. 27, 2001

(54) METHOD AND APPARATUS FOR GENERATING CYCLICAL REDUNDANCY CODE

(75) Inventors: Subrahmanyam Dravida, Freehold; Srinivasan S. Ravikumar, Morristown, both of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,927

(22) Filed: Dec. 10, 1997

(51) Int. Cl.⁷ .................................................. H03M 13/00
(52) U.S. Cl. ............................. 714/758; 714/759
(58) Field of Search .................... 714/757, 807, 714/758

(56) References Cited

U.S. PATENT DOCUMENTS

| 5,132,975 | * | 7/1992 | Avaneas | 714/757 |
| 5,325,372 | * | 6/1994 | Ish-Shalom | 714/757 |
| 5,428,629 | * | 6/1995 | Gutman et al. | 714/758 |
| 5,619,516 | * | 4/1997 | Li et al. | 714/807 |
| 5,691,997 | * | 11/1997 | Lackey, Jr. | 714/807 |
| 5,878,057 | * | 3/1999 | Maa | 714/757 |

* cited by examiner

Primary Examiner—Albert De Cady
Assistant Examiner—David Ton
(74) Attorney, Agent, or Firm—Gibbons, Del Deo, Dolan, Griffinger & Vecchione

(57) ABSTRACT

The specification relates to a method and an apparatus for generating cyclical redundancy code (CRC) by analyzing segmented groups of bits from a message concurrently, producing a temporary remainder value as a result of a multiple bit lookup from a generating CRC lookup table, using the temporary remainder or a portion thereof along with the next sequential segmented group of message bits as exclusive-or inputs, taking the result of the exclusive-or output and applying the result as a lookup value from the generating CRC lookup table. The process is repeated until the message groups have been depleted, at which time the message is completely coded and the temporary remainder existing at the time represents the CRC checkbits for the message. The recursive method developed in association with the present invention is called a Recursive Syndrome Expansion (RSE).

49 Claims, 5 Drawing Sheets

METHOD AND APPARATUS FOR GENERATING CYCLICAL REDUNDANCY CODE

FIELD OF THE INVENTION

The present invention relates to the field of data transmission error control coding, and more particularly to methods for generating cyclical redundancy code (CRC) in message groups rather than bitwise.

BACKGROUND OF THE INVENTION

Digital information transmitted from a sending station to a receiving station may be protected from errors by developing code related to the individual bits comprising a message, appending the code to the original message and transmitting the message and the code to the receiving station, and then generating code at the receiving station to check for corrupted data. Because the code is related to the original message bits through a generating polynomial, the code bits are considered redundant to the message bits used to generate them. Therefore, a process which uses polynomial division to generate redundant bits is referred to as cyclical redundancy code (CRC). Typically, messages are coded bitwise in hardware, the CRC generating polynomial function provided for by utilizing linear feedback shift registers.

CRC generation in software utilizes CRC generating lookup tables, instead of shift registers, to generate the applicable CRC code. Message bits are analyzed and compared to a CRC value contained in the CRC generating lookup table, the corresponding value representing the CRC checkbit value that is appended to the original message. However, CRC generation in software is inherently slower than the hardware implementation, even when performed over several message bits concurrently. Further, prior art methods for CRC generation in software are subject to the restriction that the degree of the generating polynomial cannot exceed the size of the message unit to which it is applied.

SUMMARY OF THE INVENTION

The present invention is a method and an apparatus for generating cyclical redundancy code (CRC) by analyzing segmented groups of bits from a message concurrently, producing a temporary remainder value as a result of a multiple bit lookup from a generating CRC lookup table, using the temporary remainder or a portion thereof along with the next sequential segmented group of message bits as exclusive-or inputs, taking the result of the exclusive-or output and applying the result, as a lookup value, to the generating CRC lookup table. The process is repeated until the message groups have been depleted, at which time the message is completely coded and the temporary remainder existing at the time represents the CRC checkbits for the message. The recursive method developed in association with the present invention is dubbed a Recursive Syndrome Expansion (RSE).

Although the present invention is particularly well suited for error detection and correction within cellular and PCS wireless networks, it is also equally applicable to other digital data and multimedia communication networks, including, but not limited to, optical fiber, coaxial cable, and hybrid fiber/coax networks, public switched telephone networks (PSTN), and wireless broadcast and satellite networks.

Advantageously, the present invention and its incorporation of RSE within its implementation provides for high speed CRC creation, at little or no additional expense for additional circuitry or components in an implementing configuration, with flexibility as to size of the generating polynomial, the size of each segmented group considered, and the relative size between the generating polynomial and the segmented groups, and with flexibility for implementation mode, especially when the invention is implemented in software.

BRIEF DESCRIPTION OF THE DRAWINGS

A more complete understanding of the present invention may be obtained from consideration of the following description in conjunction with the drawings in which.

DETAILED DESCRIPTION

Figure 1:
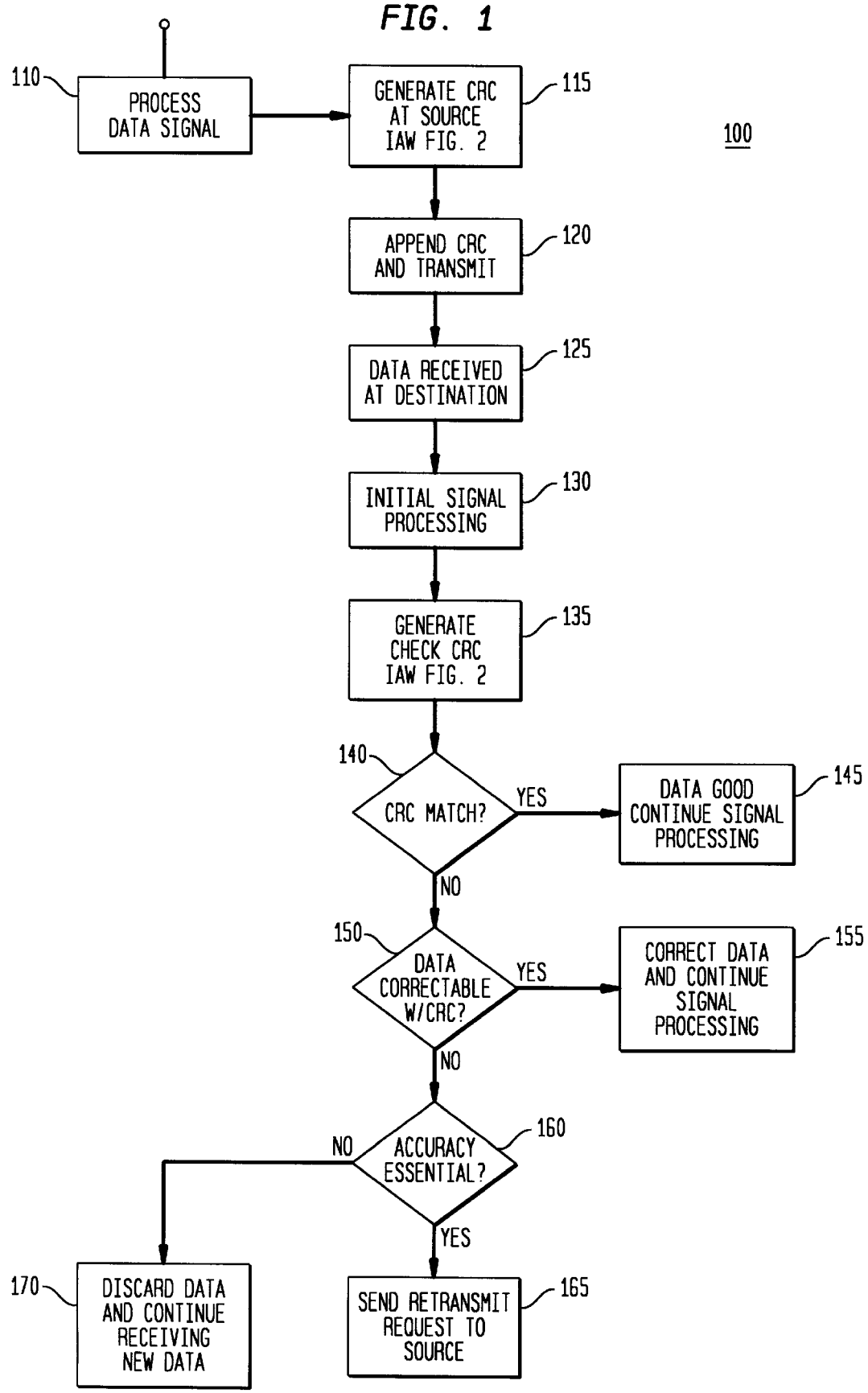
FIG. 1 is a flow chart illustrating the functional steps relating to the application of cyclical redundancy code at a source and a destination as utilized in accordance with the present invention.

FIG. 1 is a flow chart illustrating the functional steps relating to the application of cyclical redundancy code at a source and a destination as utilized in accordance with the present invention. In step 110, and after initially establishing a link and negotiating parameters, a transmitting source processes digital data in the form of messages. In step 115, and prior to transmission, the source generates a CRC syndrome from a message of a predetermined unit size, in accordance with FIG. 2 (description to follow). In step 120, the generated syndrome is then appended to the message data and transmitted to the destination. In step 125, the message and syndrome are received at the destination and initial signal processing is commenced in accordance with step 130. In step 135, the destination then independently performs a CRC calculation in accordance with FIG. 2 (description to follow) using the same generating polynomial utilized to generate the CRC syndrome at the source.

The syndrome generated at the destination is then compared with the syndrome received at the destination, in accordance with step 140. If the two syndromes match, then the received data message is accepted as non-corrupted and the data message is further processed at the destination for use, in accordance with step 145. However, if the syndrome generated at the destination and the syndrome received at the destination are contradictory, then the decision process associated with step 150 is invoked. That is, utilization of a CRC scheme enables error detection and error correction at the destination. However, some schemes utilize only the error detection capabilities of CRC without invoking the corrective capabilities. Often this scheme is utilized when the accuracy of any particular data message is not of paramount importance, such as with the synchronous nature of data transmission for voice, audio, or video. When CRC is utilized for error detection without error correction, the size of the CRC syndrome needed to accurately detect an error is smaller than the size of the CRC syndrome needed to detect and correct an error. Additionally, even when a CRC scheme is utilized to detect and correct errors, if an error is detected which contains a number of bit errors beyond the capabilities for correction by a given CRC length, the data is not recoverable. Therefore, if data errors are detected, an error correction scheme is implemented, and the quantity of bit errors does not exceed the corrective capabilities for the length of the CRC syndrome utilized, then the corrupted data message is corrected and the data message is further processed at the destination for use, in accordance with step 155. However, if the data is not correctable, either because an error correction scheme is not implemented or because the detected quantity of bit errors exceeds the corrective capabilities for the length of the CRC syndrome utilized, then the bifurcation of step 160 results. That is, if the accuracy of an uncorrectable data message is essential, a retransmit request is sent to the source, in accordance with step 165. If, however, the accuracy of an uncorrectable data message is not essential, as is the case with data messages of a synchronous nature (such as voice, audio, or video), then the corrupted and uncorrectable data message is discarded and the next sequential data message is processed, in accordance with step 170.

Figure 2:
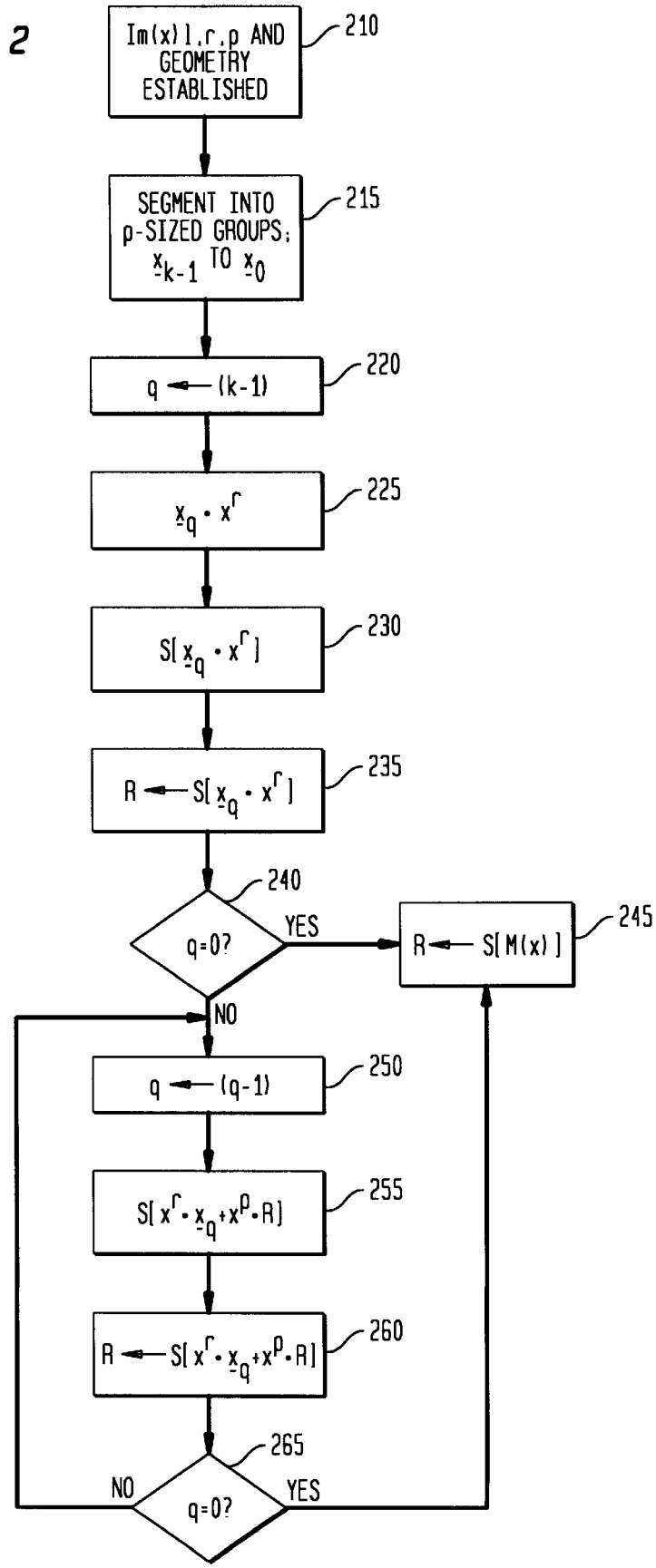
FIG. 2 is a flow chart illustrating the functional steps for generating cyclical redundancy code as performed in accordance with the present invention.

FIG. 2 is a flow chart illustrating the functional steps for generating CRC as performed in accordance with the present invention. However, a supporting mathematical basis and proof are presented prior to the detailed description supporting FIG. 2. Computation of a CRC syndrome for a data message, in accordance with the present invention, is performed by mathematically representing the data message as a polynomial with bit position i indexing the coefficients of the $x^{i-1}$ terms. The message polynomial (M(x)) is therefore described by:

$$M(x) = \sum_{i=0}^{N-1} x^i \cdot m_i \qquad [1]$$

where $m_i$ is assigned the value of zero or one as a coefficient for each exponential term represented by the message polynomial. The value of N is determined by the length of each message polynomial over which a CRC syndrome is calculated. Therefore, each data message for which CRC checkbits are calculated, in accordance with the present invention, is represented as a message polynomial of degree N.

A predetermined generator polynomial (G(x)) is used to compute the CRC syndrome, and therefore, each of the CRC checkbits, with:

$$G(x) = \sum_{k=0}^{r} x^k \cdot g_i \qquad [2]$$

where $g_i$ is assigned the value of zero or one as a coefficient for each exponential term represented by the generator polynomial and depending upon a selection of a specific generator polynomial to determine each appropriate $g_i$ value. Therefore, the degree of generator polynomial G(x) is r. Rather than compute the CRC syndrome N bits at a time (that is, computation of the syndrome considering each bit of the message simultaneously), the present invention calculates p bits at a time, thus minimizing the required storage for a checkbit lookup table. Therefore, the message polynomial M(x) can be written as:

$$M(x) = \sum_{i=0}^{k-1} \underline{x}_i \cdot x^{i*p} \qquad [3]$$

where the polynomial consists of (k–1) terms, each term being p bits in length, so that $$N=k*p \qquad [4]$$

and each group of p bits is represented by $$\underline{x}_i = \sum_{l=0}^{p-1} x^l \cdot m_j \qquad [5]$$

where $$j=[(i*p)+l] \qquad [6]$$

Equation [1] can therefore be rewritten as:

$$M(x)=\underline{x}_0+x^p(\underline{x}_1+x^p(\underline{x}_2+x^p(\ldots+x^p(\underline{x}_{k-2}+x^p(x_{k-1})\ldots)) \qquad [7]$$

The syndrome operator is represented by the symbol S[ ], where $$S[f(x)] = \left\lfloor \frac{x^r \cdot f(x)}{G(x)} \right\rfloor \qquad [8]$$

Implementation of the present invention for generation of CRC checkbits (that is, the coefficients representing the syndrome polynomial) utilizes two properties applicable to binary polynomials; (i) the property of linearity and (ii) an asserted property. The linearity property is represented by the relationship $$S[f(x)+g(x)]=S[f(x)]+S[g(x)] \qquad [9]$$

meaning that the syndrome of the sum of two functions is equal to the sum of the syndrome of the first function with the syndrome of the second function. The property of linearity is an established property, as would be apparent to those skilled in the art. The asserted property, with developed proof subsequently provided, is represented by the claim that:

$$S[f(x)\cdot g(x)]=S[f(x)\cdot S[g(x)]] \qquad [10]$$

which is described by the expression "the syndrome of the product of two binary polynomials is equal to the syndrome of the product of the first polynomial and the syndrome of the second polynomial."

Let $$f(x)=Q(x)\cdot G(x)+S[f(x)] \qquad [11]$$

where Q(x) is a quotient polynomial. Multiplying both sides of equation [11] by g(x) results in $$g(x)\cdot f(x)=g(x)\cdot Q(x)\cdot G(x)+g(x)\cdot S[f(x)] \qquad [12]$$

Applying the syndrome operator to both sides of equation [12] gives $$S[g(x) \cdot f(x)] = [0] + S[g(x) \cdot S[f(x)]] \qquad [13]$$

since S[ ] is a linear operator and because the term [g(x)·Q(x)·G(x)] is divisible by G(x) without a remainder (since Q(x), the quotient function, is represented as a factor). Therefore, applying equations [9] and [10] to equation [7]

$$S[x'M(x)] = S[x'(\underline{x}_0 + x^p(\underline{x}_1 + x^p(\underline{x}_2 + \underline{x}^p( \ldots + x^p(\underline{x}_{k-2} + x^p(\underline{x}_{k-1}) \ldots ))] \qquad [14]$$

$$= S[x'\underline{x}_0 + x^p(x'\underline{x}_1 + x^p( \ldots + (x'\underline{x}_{k-2} + x^p(x'\underline{x}_{k-1}) \ldots ))] \qquad [15]$$

$$= S[x'\underline{x}_0 + x^p S[x'\underline{x}_1 + x^p S[ \ldots + S[x^p S[x'\underline{x}_{k-2} + x^p S[x'\underline{x}_{k-1}] \ldots ] \qquad [16]$$

Advantageously, the terms of equation [16] represent the steps, as utilized in accordance with the present invention, for a systematic methodology of determining the syndrome (and thus generating the checkbits) from a data message of arbitrary length through computations performed on p bits of data concurrently and with an equivalent generator polynomial of degree r. The process of calculating CRC group checkbits concurrently and utilizing prior calculated group checkbits as a factor affecting sequential calculations within a common message in accordance with the present invention is called a Recursive Syndrome Expansion (RSE).

Since the mathematical basis and proofs supporting implementation of the present invention have been described, attention is now directed to FIG. 2 and the accompanying detailed description. The procedure for generating CRC checkbits is equivalent whether performed at a source or a destination. Therefore, although the following description refers to steps performed at a source prior to transmitting data messages with appended CRC checkbits, it is understood that the same procedure applies equally for CRC checkbit generation at the receiving destination. When a source attempts to transmit a data message and appended CRC checkbits to a destination, the destination must generate CRC checkbits utilizing the same generating polynomial (or equivalent checkbit lookup tables) as used by the source when generating the appended checkbits. Then, in accordance with step 210, the values for data message length, the group bit size (p) for a data message which are concurrently considered, the generating polynomial degree (r), the quantity, length, and width of the generating checkbit lookup tables, and the generator implementing geometric structure must be understood and shared by the source and destination. Various alternative embodiments of the present invention are possible for sharing and understanding these key parameters, as would be apparent to those skilled in the art. In one embodiment of the present invention, each of the values and parameters described is fixed at both source and destination, so that negotiation between the source and destination is not required prior to commencing data message transmission. Another alternative embodiment of the present invention presupposes no initial shared understanding between source and destination regarding data message length, p, r, the quantity, length, or width of the generating checkbit lookup tables, or the implementing geometric structure of the generator. Also, while the values for r and the specific generator, G(x), need to be shared (at some point prior to production of CRC checkbits) between the transmitter and receiver, the specific value for p can be independently chosen by the transmitter and receiver. Therefore, negotiations fixing these parameters are conveyed between source and destination prior to data message transmission. Yet other alternative embodiments maintain one or more of these initializing parameters fixed, thus providing flexibility by allowing each of the other requisite parameters to be negotiated during preliminary transmissions between source and destination (and prior to data message transmission).

In step 215, bits from a data message, N bits in length, are segmented into groups of size p bits, resulting in k groups, represented by $\underline{x}_{k-1}$ to $\underline{x}_0$. The convention utilized in conjunction with an embodiment of the present invention assigns $\underline{x}_0$ as the group of least significant bits, whereas $\underline{x}_{k-1}$ is assigned as the group of most significant bits for a particular data message (M(x)). Equation [7] is an expression for the data message when segmented into groups. Indexing variable (q) is set equal to the value of (k−1), in accordance with step 220. The product $\underline{x}_q \cdot x^r$ is produced in accordance with step 225. Since q is initially set equal to (k−1), the group represents the most significant bits group of least significant bits of M(x). The syndrome is then generated in accordance with step 230. Syndrome generation, in accordance with the present invention, is accomplished utilizing checkbit lookup table(s). In the simplest embodiment of the present invention, table checkbit lookup values are provided in one table for each possible sequence represented by the coefficients of $\underline{x}_q \cdot x^r$, and therefore the implementing lookup table contains $2^{(q+r)}$ entries. The value assigned to r is not restricted in relation to the message size and therefore r may be equal to, greater than, or less than the parallelism (implementation group size) desired. Each of the $2^{(q+r)}$ entries is of length r bits. However, other efficacious configurations utilizing a plurality of tables are also contemplated, as is subsequently described in conjunction with several alternative embodiments of the present invention.

A remainder value (data message checkbits), R, is then set equal to the coefficients of the syndrome generated from the $\underline{x}_{k-1}$ group, in accordance with step 235. The value of q is then examined in accordance with step 240. If q is equal to zero, then checkbit generation is complete, R is appended to the respective generating data message, and the next sequential data message is considered for CRC generation. The value of q is equal to zero while performing step 240 only when N≦p, that is, when the implementing group length is less than or equal to the data message length. If the value of q is not equal to zero, then in accordance with step 250, the value of q is decremented. In step 255, $x^r$ is multiplied by $\underline{x}_q$, R is multiplied by $x^p$, the resulting products are summed, and the syndrome of the sum is generated, as was previously performed, via checkbit lookup table(s). The remainder value, R, is then set equal to the coefficients of the syndrome generated from the $\underline{x}_q$ group, in accordance with step 260. The value of q is then examined in accordance with step 265. If q is equal to zero, then checkbit generation is complete, R is appended to the respective generating data message, and the next sequential data message is considered for CRC generation. If, however, the value of q is not equal to zero, then a recursive loop is entered, commencing with step 250 during which the value of q is again decremented. The recursive sequence, comprised of steps 250, 255, 260, and 265, is continued until the value of q equals zero, at which time the loop is exited, R is appended to the respective generating data message, and the next sequential data message is considered for CRC generation. This recursive sequence, in conjunction with the initial group syndrome calculation for $\underline{x}_{k-1}$, represents the method steps which implement a RSE, in accordance with equation [16].

Figure 3:
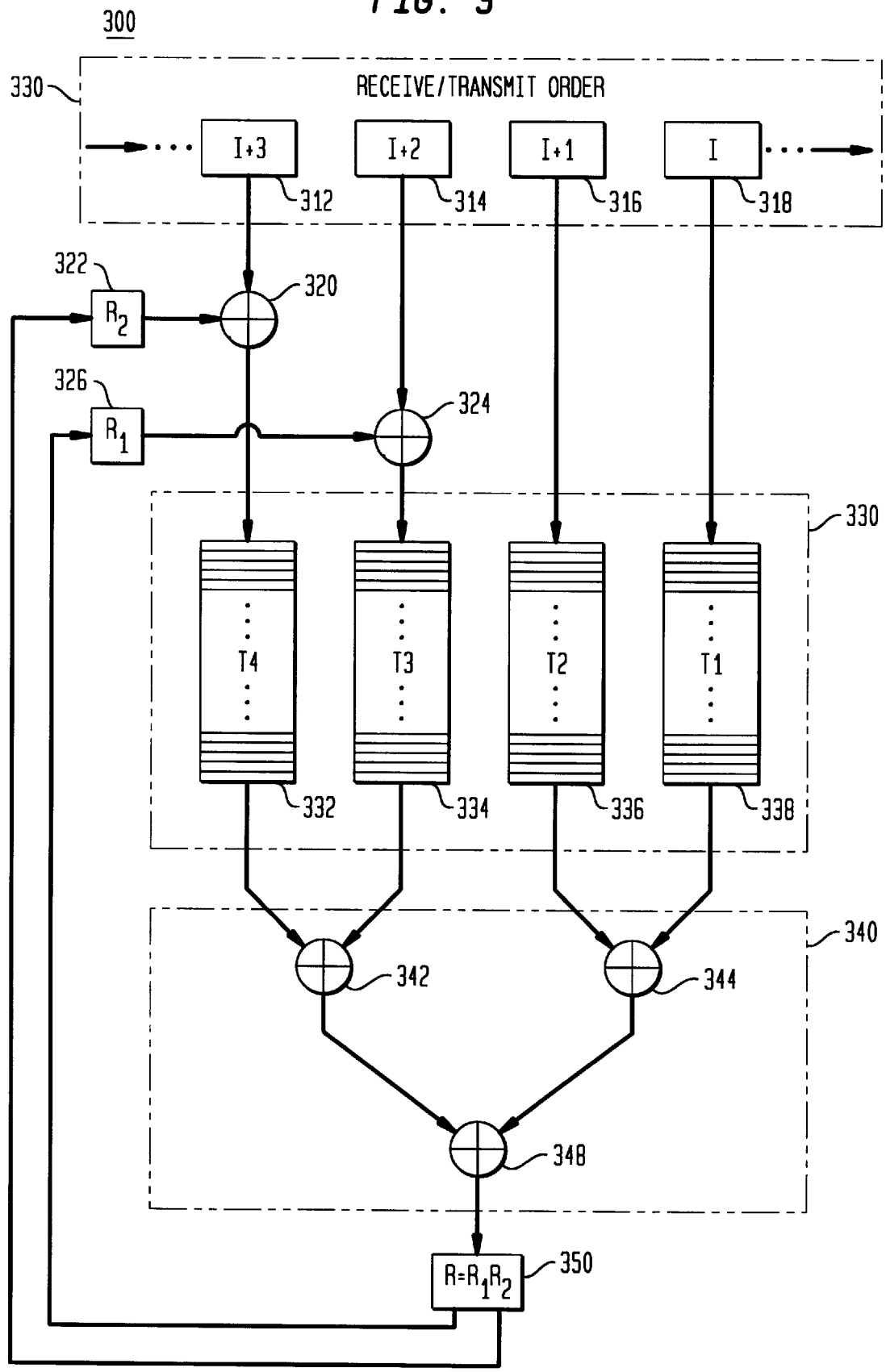
FIG. 3 is an illustration of an exemplary embodiment of the present invention utilizing a cyclical redundancy code length smaller than the length of the message group to which it is applied and implemented within a four table lookup scheme.
Figure 4:
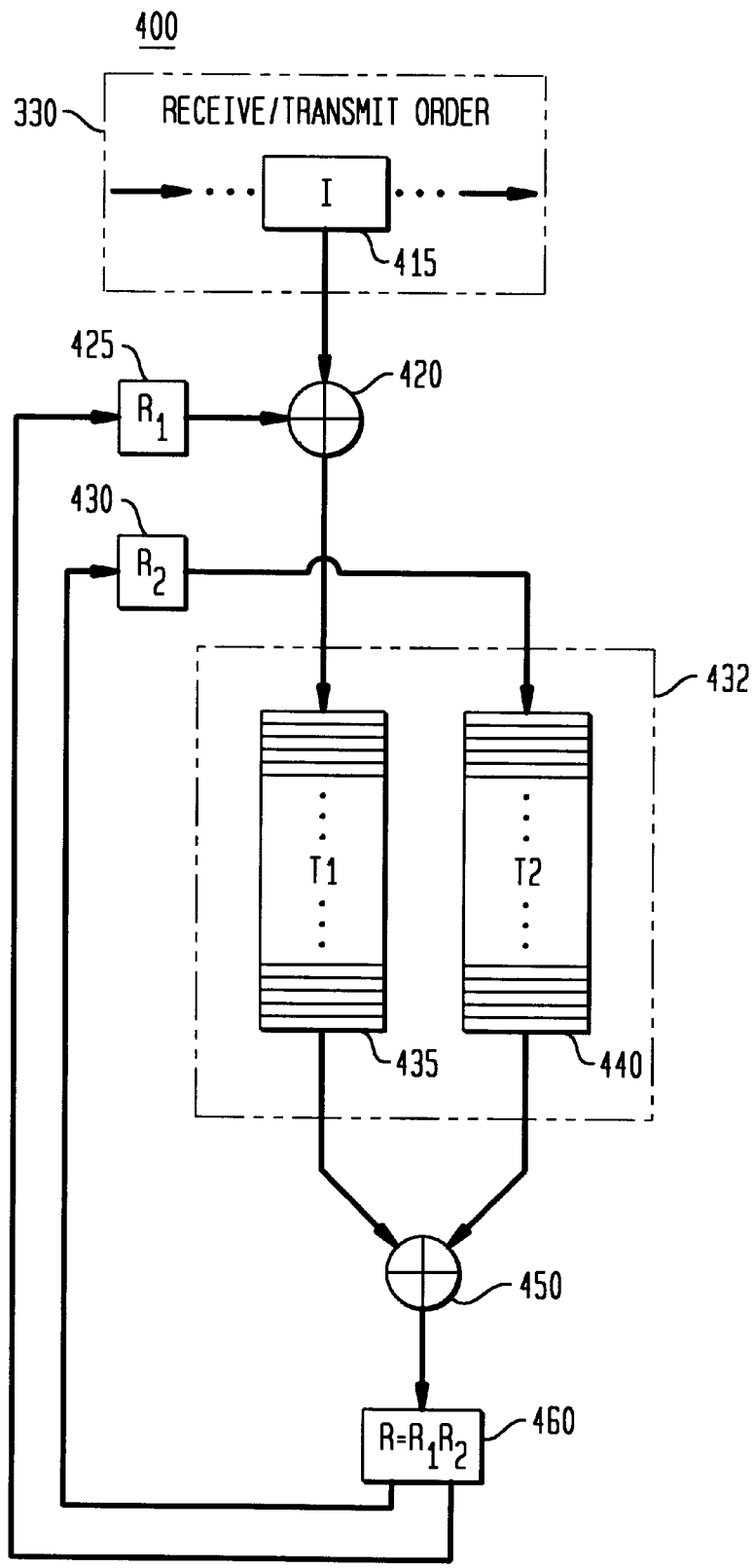
FIG. 4 is an illustration of an exemplary embodiment of the present invention utilizing a cyclical redundancy code length greater than the length of the message group to which it is applied and implemented within a two table lookup scheme.
Figure 5:
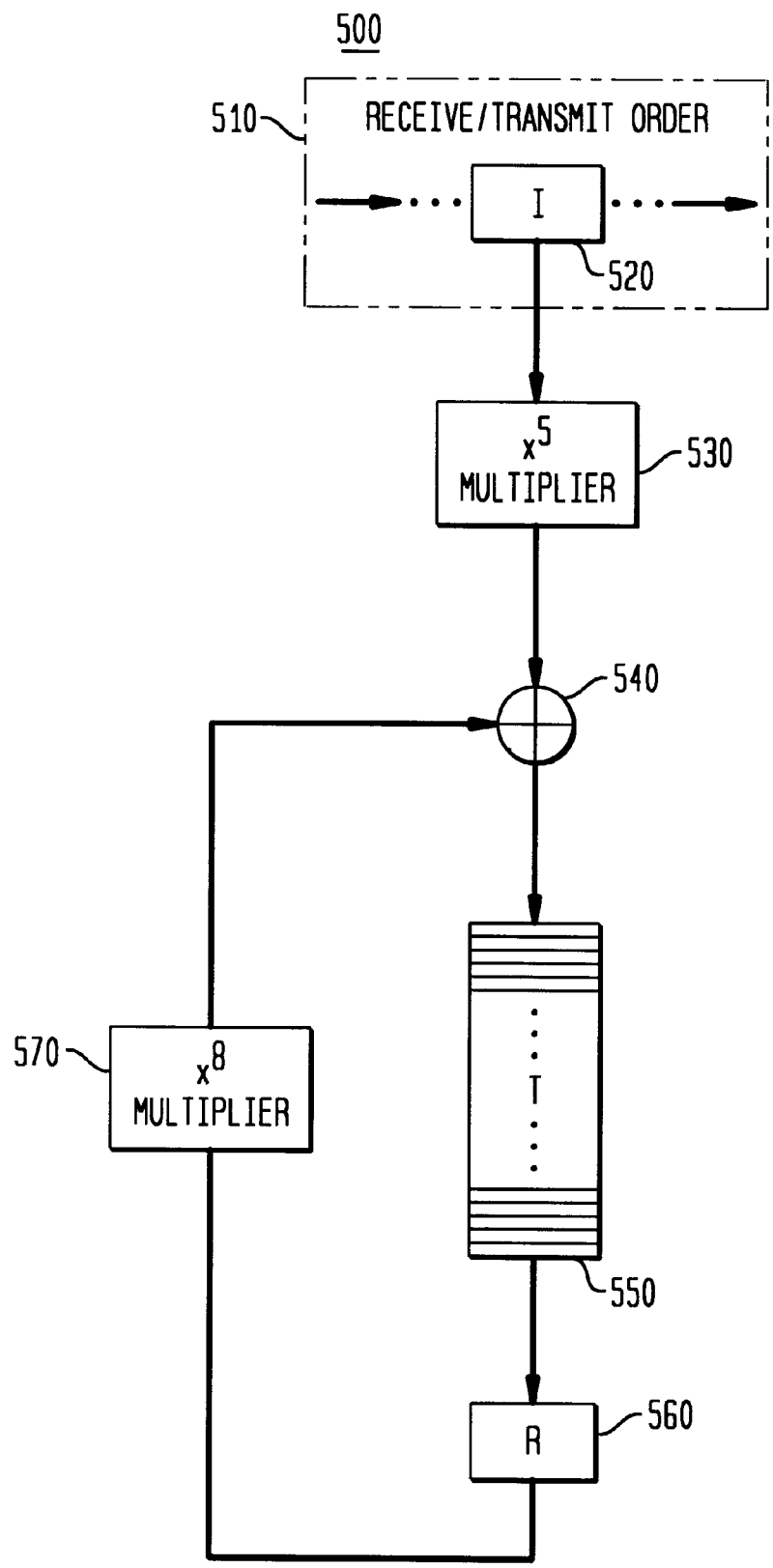
FIG. 5 is an illustration of an exemplary embodiment of the present invention utilizing bit multipliers to achieve degree alignment between a code remainder and the data bits being coded and checked.

FIGS. 3, 4, and 5 represent three illustrative embodiments of the present invention utilizing table lookup based implementations and demonstrating the invention's flexibility in that CRC length (r) may be greater than, less than, or equal to the parallelism of the implementation (p), and that group sizes other than those which are integral multiples of an octet may be contemplated. They are illustrative embodiments only, and not exhaustive, since a recursive syndrome expansion, in accordance with equation [16], allows any arbitrary parallel implementation once a CRC size is established, as would be apparent to those skilled in the art.

FIG. 3 is a representation of an exemplary embodiment of the present invention utilizing a cyclical redundancy code length smaller than the length of the message group to which it is applied and implemented within a four table lookup scheme. CRC computations for message M(x) 310 are performed by considering a plurality of message data bits concurrently. The instant embodiment considers message data bits in groups sized 32 bits in length (that is, p=32). However, the instant embodiment also segments groups into four subgroups, each operated upon concurrently, with each subgroup comprised of eight bits. Subgroups are represented according to indexing variable I, with subgroup [I+3] 312, subgroup [I+2] 314, subgroup [I+1] 316, and subgroup [I] 318 shown, subgroup [I] representing the least significant bits and subgroup [I+3] representing the most significant bits for those subgroups shown. Prior subgroups ([I+1], [I+2], . . . ), not shown, have been processed as message bits of lessor significance in a prior recursion. Subsequent subgroups ([I+4],[I+5], . . . ), also not shown, represent message bits of greater significance and are processed in a subsequent recursion. Message data bits are CRC generation seeds for a checkbit lookup unit 330, which is comprised of four individual implementation tables; T1 338, T2 336, T3 334, and T4 332. Subgroup bits are read from the appropriate message subgroup and corresponding checkbit values are set, depending upon the incoming subgroup bit values. Therefore, bit values from subgroup [I] 318 provide the seed value for a lookup from table T1 338, bit values from subgroup [I+1] 316 provide the seed value for a lookup from table T2 336, bit values from subgroup [I+2] 314 provide the seed value (after an exclusive-or operation with a prior recursion remainder, $R_1$, at an interveningly coupled [I+2] EXOR gate 324) for a lookup from table T3 334, and bit values from subgroup [I+3] 312 provide the seed value (after an exclusive-or operation with a prior recursion remainder, $R_2$, at an interveningly coupled [I+3] EXOR gate 320) for a lookup from table T4 332. Each table stores entries for a total of 256 checkbit lookup values, since each table is implemented with an eight bit lookup seed. The instant embodiment of the present invention generates a sixteen bit CRC (sixteen checkbits) for each respective lookup seed, therefore r=16. As a programmed alternative to hardware CRC, table checkbit storage is accomplished within any of a number of alternative storage devices and components including, but not limited to, RAM, ROM, magnetic or optical storage devices, PROM or EPROM, fixed component memory, or any other memory devices deemed appropriate for a given application, as would be apparent to those skilled in the art.

The checkbit lookup unit 330 is coupled to an Exclusive-Or (EXOR) unit 340 and each group of sixteen checkbits generated are transmitted thereover. The instant embodiment of the EXOR unit 340 is comprised of three EXOR gates. A first EXOR gate 342 is coupled to the output from tables T3 and T4 and accepts thereover each sequential group of sixteen checkbits generated, performs an exclusive-or operation on a bit by bit basis between the T4 and T3 checkbits, and returns a sixteen bit value in response. A second EXOR gate 344 is coupled to the output from tables T2 and T1 and accepts thereover each sequential group of sixteen checkbits generated, performs an exclusive-or operation on a bit by bit basis between the T2 and T1 checkbits and returns a sixteen bit value in response. A third EXOR gate 348 is coupled to the output of the first and second EXOR gates, accepts each sequential group of sixteen checkbits generated from each, performs a bitwise exclusive-or comparison and yields a remainder, R, as a result. The value of R is recomputed during each recursion. The EXOR unit 340 output is coupled to a R storage and segmenting device 350. The storage function of the R storage and segmenting device 350 is used to store the prior calculated recursion value of R for use in the next CRC recursion calculation. Therefore, a shift register or bubble memory device are typically used to implement the storage function, although RAM, ROM, magnetic or optical storage devices, PROM or EPROM, fixed component memory, or any other memory devices deemed appropriate for a given application are suitable alternatives, as would be apparent to those skilled in the art. The segmenting function of the R storage and segmenting device 350 bifurcates the current value of R into $R_1$ and $R_2$ for use in the next recursion. $R_1$ represents the most significant R bits, whereas $R_2$ represents the least significant R bits. $R_1$ is coupled as an input to an [I+2] EXOR gate 324 via an $R_1$ link 326. $R_2$ is coupled as an input to an [I+3] EXOR gate 320 via an $R_2$ link 322.

The embodiment as illustrated in FIG. 3 is a 32 bit parallel implementation utilizing a 16 bit CRC (p=32 and r=16). Each table is comprised of 256 entries ($2^8$=256, since each subgroup is comprised of eight bits and each possible subgroup combination returns a checkbit value). The remainder R has a degree of 15 or less, since R is always at least one degree less than the degree of the generating polynomial. The term $x^p R$ has a degree of 47 or less, since $x^p$ has a degree of 32 and R has a degree of 15 or less. The term $\underline{x}_q x^r$ has a degree of 47 or less, since $\underline{x}_q$ has a degree of 31 or less and $x^r$ has a degree of 16. Therefore terms $x^p R$ and $\underline{x}_q x^r$ are in perfect alignment.

A functional description of the instant embodiment of the present invention is furnished by letting [I], [I+1], [I+2], and [I+3] represent the message bit values of a message group comprised of four intermediate message bytes within M(x), with [I] being the least significant byte and [I+3] being the most significant byte. The current remainder, R [I−1], is a value calculated and influenced by message bytes through [I−1]. The remainder is segmented into two bytes, $R_1$[I−1] and $R_2$[I−1], where $R_1$[I−1] is the most significant R[I+4] byte and $R_2$[I−1] is the least significant R[I+4] byte. The next sequential recursion then yields a remainder, R[I+3], whose value is calculated and influenced by message bytes through [I+3]. The sequential recursion through [I+3] is described by $$R[I+3]=T1[I] \oplus T2[I+1] \oplus T3(R_1[I-1] \oplus [I+2]) \oplus T4(R_2[I-1] \oplus [I+3])$$

with the process repeated for subsequent message bytes until the message is complete, at which time the existing remainder represents M(x) CRC checkbits, R is appended to M(x) and transmitted to the destination.

FIG. 4 is a representation of an exemplary embodiment of the present invention utilizing a cyclical redundancy code length greater than the length of the length of the message group to which it is applied and implemented within a two table lookup scheme. CRC computations for message M(x) 410 are performed by considering a plurality of message data bits concurrently. The instant embodiment of the present invention considers message data bits in groups sized eight bits in length (that is, p=8). An intermediate message group, [I] 415, is shown. Prior groups ([I+1], [I+2], ... ), not shown, have been processed as message bits of lessor significance in a prior recursion. Subsequent groups ([I−1],[I−2], ... ), also not shown, represent message bits of greater significance and are processed in a subsequent recursion. Message data bits are CRC generation seeds provided to a checkbit lookup unit 432, which is comprised of two individual implementation tables; T1 435 and T2 440. Group bits are read from a message group and the corresponding checkbit values are set, the checkbit values depending upon the value of the incoming group bits. Therefore, bit values from group [I] 415 provide the seed value for a lookup from table T1 435 (after an exclusive-or operation with prior recursion remainder $R_1$ at an interveningly coupled [I] EXOR gate 420). The output from the [I] EXOR gate 420 is coupled to lookup table T1 435, which provides a T1 checkbit output. Each table stores entries for a total of 256 checkbit lookup values, since each table is implemented with an eight bit lookup seed. The instant embodiment of the present invention generates a sixteen bit CRC (sixteen checkbits) for each respective lookup seed, therefore r=16. As a programmed alternative to hardware CRC, table checkbit storage is accomplished within any of a number of alternative storage devices and components including, but not limited to, RAM, ROM, magnetic or optical storage devices, PROM or EPROM, fixed component memory, or any other memory devices deemed appropriate for a given application, as would be apparent to those skilled in the art.

Prior recursion remainder R2 is coupled as an input to table T2 440, which provides a T2 checkbit output. An EXOR gate 432 is coupled to the output from tables T1 and T2 and accepts thereover each sequential group of sixteen checkbits generated, performs an exclusive-or operation on a bit by bit basis between the T1 and T2 checkbits, and returns a sixteen bit remainder, R, as the EXOR gate 450 output. The value of R is recomputed during each recursion. The EXOR gate 450 output is coupled to a R storage and segmenting device 460. The storage function of the R storage and segmenting device 460 is used to store the prior calculated recursion value of R for use in the next CRC recursion calculation. Therefore, a shift register or bubble memory device are typically used to implement the storage function, although RAM, ROM, magnetic or optical storage devices, PROM or EPROM, fixed component memory, or any other memory devices deemed appropriate for a given application are suitable alternatives, as would be apparent to those skilled in the art. The segmenting function of the R storage and segmenting device 460 bifurcates the current value of R into $R_1$ and $R_2$ for use in the next recursion. $R_1$ represents the most significant R bits, whereas $R_2$ represents the least significant R bits. $R_1$ is coupled as an input to the [I] EXOR gate 420 via an $R_1$ link 425. $R_2$ is coupled as an direct eight bit lookup to table T2 440 via an $R_2$ link 430.

The embodiment as illustrated in FIG. 4 is a eight bit parallel implementation utilizing a 16 bit CRC (p=8 and r=16). Each table is comprised of 256 entries ($2^8$=256, since each group is comprised of eight bits and each possible group combination returns a checkbit value). The remainder R has a degree of 15 or less, since R is always at least one degree less than the degree of the generating polynomial. The term $x^p R$ has a degree of 23 or less, since $x^p$ has a degree of 8 and R has a degree of 15 or less. The term $\underline{x}_q x^r$ has a degree of 23 or less, since $\underline{x}_q$ has a degree of 7 or less and $x^r$ has a degree of 16. Therefore terms $x^p R$ and $\underline{x}_q x^r$ are in perfect alignment.

A functional description of the instant embodiment of the present invention is furnished by letting [I] represent the message bit values of a message group comprised of eight bits (one byte) within M(x). The current remainder, R[I+1], is a value calculated and influenced by message bytes through [I+1]. The remainder is segmented into two bytes, $R_1$[I+1] and $R_2$[I+1], where $R_1$[I+1] is the most significant R[I+1] byte and $R_2$[I+1] is the least significant R[I+1] byte. The next sequential recursion then yields a remainder, R[I], whose value is calculated and influenced by message bytes through [I]. The sequential recursion through [I] is described by $$R[I]=T1(R_1[I+1]\oplus[I])\oplus T2(R_2[I+1])$$

with the process repeated for subsequent message bytes corresponding to subsequent I values ([I−1],[I−2], ... ) until the message is complete, at which time the existing remainder represents M(x) CRC checkbits and R is appended to M(x) and transmitted to the destination.

FIG. 5 is an illustration of an exemplary embodiment of the present invention utilizing bit multipliers to achieve degree alignment between a code remainder and the data bits being coded and checked. CRC computations for message M(x) 510 are performed by considering a plurality of message data bits concurrently. The instant embodiment of the present invention considers message data bits in groups sized eight bits in length (that is, p=8). An intermediate message group, [I] 520, is shown. Prior groups ([I+1], [I+2], ... ), not shown, have been processed as message bits of lessor significance in a prior recursion. Subsequent groups ([I−1],[I−2], ... ), also not shown, represent message bits of greater significance and are processed in a subsequent recursion. Message data bits are coupled and conveyed thereover to a $x^5$ multiplier 530, effectively converting the eight bit message data input into the coefficients of a twelfth degree polynomial. The output of the $x^5$ multiplier 530 is then coupled as an input to an EXOR gate 540. The second input coupled and conveyed thereover as an input to EXOR gate 540 are the coefficients of a function dependent upon prior recursion remainder R 560. The output of EXOR gate 540 is coupled as an input to a checkbit lookup table, T 550. The individual bit values of the output of EXOR gate 540 determines which corresponding checkbit values are set by comparing the individual bit values to a lookup table 550. The table 550 stores entries for a total of 8,192 checkbit lookup values, since each table is implemented with a thirteen bit lookup seed. The instant embodiment of the present invention generates a five bit CRC (five checkbits) for each respective lookup seed, therefore r=5. As a programmed alternative to hardware CRC, table checkbit storage is accomplished within any of a number of alternative storage devices and components including, but not limited to, RAM, ROM, magnetic or optical storage devices, PROM or EPROM, fixed component memory, or any other memory devices deemed appropriate for a given application, as would be apparent to those skilled in the art.

The table 550 output is a recursive remainder, R, which is recomputed during each recursion. The table 550 output is coupled to a storage device 560 and the most recent calculated R value is conveyed thereover. The storage device 560 is utilized to store the prior calculated recursion value of R for use in the next CRC recursion calculation. Therefore, a shift register or bubble memory device is typically used to implement the storage function, although RAM, ROM, magnetic or optical storage devices, PROM or EPROM, fixed component memory, or any other memory devices deemed appropriate for a given application are suitable alternatives, as would be apparent to those skilled in the art. The storage device 560 output is coupled to a $x^8$ multiplier 570. The $x^8$ multiplier 570 effectively converts the five bit value of R into the coefficients of a twelfth degree polynomial. The $x^8$ multiplier 570 output is coupled as an input to the EXOR gate 540.

The embodiment as illustrated in FIG. 5 is a eight bit parallel implementation utilizing a five bit CRC (p=8 and r=5). The lookup table 550 is comprised of 8,192 entries ($2^{(8+5)}$=8,192, since each lookup seed is comprised of thirteen bits and each possible group combination returns a checkbit value). The remainder R has a degree of 4 or less, since R is always at least one degree less than the degree of the generating polynomial. The term $x^p R$ has a degree of 12 or less, since $x^p$ has a degree of 8 and R has a degree of 4 or less. The term $\underline{x}_q x^r$ has a degree of 12 or less, since $\underline{x}_q$ has a degree of 7 or less and $x^r$ has a degree of 5. Therefore terms $x^p R$ and $\underline{x}_q x^r$ are in perfect alignment.

A functional description of the instant embodiment of the present invention is furnished by letting [I] represent the message bit values of a message group comprised of eight bits (one byte) within M(x). The current remainder, R[I+1], is a value calculated and influenced by message bytes through [I+1]. The next sequential recursion then yields a remainder, R[I], whose value is calculated and influenced by message bytes through [I]. The sequential recursion through [I] is described by $$R[I]=T\{[x^5 \cdot I] \oplus [x^8 \cdot R[I+1]]\}$$

with the process repeated for subsequent message bytes corresponding to subsequent I values ([I−1],[I−2], . . . ) until the message is complete, at which time the existing remainder represents M(x) CRC checkbits and R is appended to M(x) and transmitted to the destination.

In accordance with another embodiment of the present invention, storage requirements for a CRC lookup table are reduced by implementing a Reduced Table lookup algorithm. Creating and implementing a Reduced Table lookup algorithm is a task well known to those skilled in the art. A Reduced Table lookup algorithm looks to each bit in a message group individually. Looking first to the least significant bit in a data message group, if the value of the bit is set ($m_i$=1), then the least significant bit lookup value is accepted as the initial checkbit value. The next least significant bit is then examined and if its bit is set, then the lookup table value corresponding to its bit position is EXOR'ed with the prior checkbit value. The result represents the new checkbit value. The process is continued bitwise until the most significant bit associated with a data message group is processed. The resulting checkbit value represents the CRC value assigned to the data message group.

Numerous modifications and alternative embodiments of the present invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims are reserved.

What is claimed is:

1. A method of generating cyclical redundancy code (CRC) comprising the steps of:
   segmenting a message into a plurality of message groups;
   generating a current remainder value by applying a current message group of said plurality as a lookup value to a CRC lookup table;
   creating a next lookup value via an exclusive-or operation between said current remainder value and at least one select subgroup of a next message group of said plurality;
   applying said next lookup value to said CRC lookup table to genaerate a new remainder value, said new remainder value to be applied in a next iteration as said current remainder value; and
   recursively and sequentially repeating said steps of creating and applying until a final group of said plurality of message groups has been processed.

2. The method in accordance with claim 1 wherein said step of recursively and sequentially repeating said steps of creating and applying is implemented utilizing a Recursive Syndrome Expansion.

3. The method in accordance with claim 2 wherein said Recursive Syndrome Expansion is defined by the equation $$S[x^r M(x)]=S[x^r \underline{x}_0 + x^p S[x^r \underline{x}_1 + x^p S[\ldots + S[x^p S[x^r \underline{x}_{k-2} + x^p S[x^r \underline{x}_{k-1}] \ldots ]$$

where r represents the bit quantity for each entry in said CRC lookup table, where $\underline{x}_0$ through $\underline{x}_{k-1}$ represent each of said plurality of message groups segmented within said message, where S[ ] represents a syndrome operator, where p represents the bit quantity for each of said plurality of message groups, and where M(x) represents said message.

4. The method in accordance with claim 3 wherein said CRC lookup table is implemented utilizing a plurality of individual CRC lookup tables concurrently.

5. The method in accordance with claim 4 wherein a respective plurality of outputs from said plurality of individual CRC lookup tables are combined via an exclusive-or operation to form said new remainder value.

6. The method in accordance with claim 5 wherein said new remainder value is segmented into a plurality of remainders, each of said plurality of remainders indexed for utilization in conjunction with a respective CRC lookup table from said plurality of individual CRC lookup tables.

7. The method in accordance with claim 1 wherein a message group polynomial multiplier is applied to each of said plurality of message groups prior to performing said step of creating said next generating seed, said message group polynomial multiplier providing for bitwise alignment.

8. The method in accordance with claim 1 wherein a remainder polynomial multiplier is applied to said new remainder value prior to performing said step of creating said next generating seed, said remainder polynomial multiplier providing for bitwise alignment.

9. A method for generating a cyclical redundancy code (CRC) from a message, said method operable irrespective of the relative lengths of said CRC and said message, said method comprising the steps of:
   segmenting said message into a plurality of message groups;
   generang a current remainder value by applying a current message group of said plurality as a lookup value to a CRC lookup table;
   creating a next lookup value via an exclusive-or operation between said current remainder value and at least one select subgroup of a next message group of said plurality;
   applying said next lookup value to said CRC lookup table to generate a new remainder value, said remainder value to be applied in a next iteration as said current remainder value;

recursively and sequentially repeating said steps of creating and applying until a final group of said plurality of message groups has been processed; and setting a message CRC checkbit value equal to corresponding bit values of said new remainder value.

10. The method in accordance with claim 9 wherein said CRC lookup table is implemented utilizing a Reduced Table lookup algorithm.

11. The method in accordance with claim 9 wherein said step of recursively and sequentially repeating said steps of creating and applying is implemented utilizing a Recursive Syndrome Expansion.

12. The method in accordance with claim 11 wherein said Recursive Syndrome Expansion is defined by the equation $$S[x^rM(x)]=S[x^r\underline{x}_0+x^pS[x^r\underline{x}_1+x^pS[\ldots+S[x^pS[x^r\underline{x}_{k-2}+x^pS[x^r\underline{x}_{k-1}]\ldots]$$

where r represents the bit quantity for each entry in said CRC lookup table, where $\underline{x}_0$ through $\underline{x}_{k-1}$ represent each of said plurality of message groups segmented within said message, where S[ ] represents a syndrome operator, where p represents the bit quantity for each of said plurality of message groups, and where M(x) represents said message.

13. The method in accordance with claim 12 wherein said CRC lookup table is implemented utilizing a plurality of individual CRC lookup tables concurrently.

14. The method in accordance with claim 13 wherein a respective plurality of outputs from said plurality of individual CRC lookup tables are combined via an exclusive-or operation to form said new remainder value.

15. The method in accordance with claim 14 wherein said remainder and said new remainder value are segmented into a plurality of remainders, each of said plurality of remainders indexed for utilization in conjunction with a respective CRC lookup table from said plurality of individual CRC lookup tables.

16. The method in accordance with claim 9 wherein a message group polynomial multiplier is applied to each of said plurality of message groups prior to performing said step of creating said next generating seed, said message group polynomial multiplier providing for bitwise alignment.

17. The method in accordance with claim 9 wherein a remainder polynomial multiplier is applied to said new remainder value prior to performing said step of creating said next generating seed, said remainder polynomial multiplier providing for bitwise alignment.

18. A method for generating a cyclical redundancy code (CRC) from a message, said method operable irrespective of the relative lengths of said CRC and said message, said method comprising the steps of:

segmenting said message into a plurality of message groups;

segmenting each of said plurality of message groups into a plurality of message subgroups;

generating a checkbit value from each of said plurality of message subgroups by applying a plurality of current message group subgroups as a plurality of lookup values to a respective plurality of CRC lookup tables;

generating a current remainder value through an exclusive-or operation between checkbit values generated from each of said plurality of message subgroups;

creating a next plurality of lookup values via an exclusive-or operation between said current remainder value and at least one select subgroup of a next plurality of message group subgroups;

applying said next plurality of lookup values to said respective plurality of CRC lookup tables to generate a new plurality of message checkbits from each of said plurality of message subgroups;

forming a new remainder value through an exclusive-or operation utilizing said new plurality of message checkbits, said new remainder value to be applied in a next iteration as said current remainder value;

recursively and sequentially repeating said steps of creating, applying, and forming until a final group of said plurality of message groups has been processed; and setting a message CRC checkbit value equal to corresponding bit values of said new remainder value.

19. The method in accordance with claim 18 wherein said step of recursively and sequentially repeating said steps of creating, applying, and forming is implemented utilizing a Recursive Syndrome Expansion.

20. The method in accordance with claim 19 wherein said Recursive Syndrome Expansion is defined by the equation $$S[x^rM(x)]=S[x^r\underline{x}_0+x^pS[x^r\underline{x}_1+x^pS[\ldots+S[x^pS[x^r\underline{x}_{k-2}+x^pS[x^r\underline{x}_{k-1}]\ldots]$$

where r represents the bit quantity for each entry in said CRC lookup table, where $\underline{x}_0$ through $\underline{x}_{k-1}$ represent each of said plurality of message groups segmented within said message, where S[ ] represents a syndrome operator, where p represents the bit quantity for each of said plurality of message groups, and where M(x) represents said message.

21. The method in accordance with claim 20 wherein said step of segmenting each of said plurality of message groups into a plurality of message subgroups, said step of generating a checkbit value, and said step of generating a remainder value represent an additional imbedded application of a Recursive Syndrome Expansion applied over said plurality of message subgroups for each of said plurality of message groups.

22. The method in accordance with claim 21 wherein said remainder value and said new remainder value are segmented into a plurality of remainder segments, each of said plurality of remainder segments utilized for an exclusive-or operation with a respective plurality of message subgroups selected from said plurality of message subgroups.

23. The method in accordance with claim 22 wherein a message subgroup polynomial multiplier is applied to each of said plurality of message subgroups prior to performing said step of creating said next plurality of generating seeds, said message subgroup polynomial multiplier providing for bitwise alignment.

24. The method in accordance with claim 21 wherein a remainder polynomial multiplier is applied to said new remainder value prior to performing said step of creating said next plurality of generating seeds, said remainder polynomial multiplier providing for bitwise alignment.

25. The method in accordance with claim 18 wherein the degree of a polynomial representing the individual bits of each of said plurality of message groups is greater than the degree of a polynomial representing said message CRC checkbit value.

26. The method in accordance with claim 18 wherein the degree of a polynomial representing the individual bits of each of said plurality of message groups is less than the degree of a polynomial representing said message CRC checkbit value.

27. The method in accordance with claim 18 wherein the degree of a polynomial representing the individual bits of each of said plurality of message groups is equal to the degree of a polynomial representing said message CRC checkbit value.

28. An apparatus for generating a cyclical redundancy code (CRC) from a message irrespective of the relative lengths of said CRC and said message, said apparatus comprising:
- at least one memory device operable to store a plurality of CRC lookup tables;
- an exclusive-or unit coupled to at least one output from said at least one memory device, said exclusive-or unit operable to respectively accept a plurality of outputs from said plurality of CRC lookup units and produce a remainder as an exclusive-or output;
- a remainder memory devce operable to store at least one prior remainder value; and
- at least one generating seed exclusive-or gate operable to accept said at least one prior remainder value and a group of message bits and perform a bitwise exclusive-or operation on said prior remainder value and at least one select subgroup of said group of message bits to generate a lookup seed for at least one of said plurality of lookup tables, other subgroups of said group being applied to others of said plurality of lookup tables.

29. The apparatus in accordance with claim 28 wherein said exclusive-or unit and said remainder memory device provide feedback to said at least one generating seed exclusive-or gate, thereby implementing a Recursive Syndrome Expansion.

30. The apparatus in accordance with claim 29 wherein said Recursive Syndrome Expansion is defined by the equation $$S[x^r M(x)] = S[x^r \underline{x}_0 + x^p S[x^r \underline{x}_1 + x^p S[ \ldots + S[x^p S[x^r \underline{x}_{k-2} + x^p S[x^r \underline{x}_{k-1}] \ldots ]$$

where r represents the bit quantity for each entry in said plurality of CRC lookup tables, where $\underline{x}_0$ through $\underline{x}_{k-1}$ represent each of a plurality of message groups segmented within said message, where S[ ] represents a syndrome operator, where p represents the bit quantity for each of said plurality of message groups, and where M(x) represents said message.

31. The apparatus in accordance with claim 30 wherein said at least one memory device operable to store a plurality of CRC lookup tables is implemented using random access memory (RAM).

32. The apparatus in accordance with claim 30 wherein said at least one memory device operable to store a plurality of CRC lookup tables is implemented using read only memory (ROM).

33. The apparatus in accordance with claim 30 wherein said at least one memory device operable to store a plurality of CRC lookup tables is implemented using programmable read only memory (PROM).

34. The apparatus in accordance with claim 30 wherein said at least one memory device operable to store a plurality of CRC lookup tables is implemented using electrically programmable read only memory (EPROM).

35. The apparatus in accordance with claim 30 wherein said remainder memory device is implemented using random access memory (RAM).

36. The apparatus in accordance with claim 30 wherein said remainder memory device is implemented using a bubble memory device.

37. The apparatus in accordance with claim 30 wherein said remainder memory device is implemented using at least one shift register.

38. The apparatus in accordance with claim 30 wherein said remainder memory device is implemented using random access memory (RAM).

39. An apparatus for generating cyclical redundancy code (CRC) comprising:
- means for segmenting a message into a plurality of message groups;
- means for generating a current remainder value by applying a currcnt message group of said plurality as a lookup value to a CRC lookup table;
- means for creating a next lookup value via an exclusive-or operation between said current remainder value and at least one select subgroup of a next message group of said plurality;
- means for applying said next lookup value to said CRC lookup table to generate a new remainder value, said new remainder value to be applied in a next iteration as said current remainder value, wherein said means for creating and means for applying are sequentially and recursively utilized until a final group of said plurality of message groups has been processed; and
- means for setting a message CRC checkbit value equal to corresponding bit values of said new remainder value.

40. The apparatus in accordance with claim 39 wherein said means for creating and means for applying are sequentially and recursively utilized to implement a Recursive Syndrome Expansion.

41. The method in accordance with claim 40 wherein said Recursive Syndrome Expansion is defined by the equation $$S[x^r M(x)] = S[x^r \underline{x}_0 + x^p S[x^r \underline{x}_1 + x^p S[ \ldots + S[x^p S[x^r \underline{x}_{k-2} + x^p S[x^r \underline{x}_{k-1}] \ldots ]$$

where r represents the bit quantity for each entry in said CRC lookup table, where $\underline{x}_0$ through $\underline{x}_{k-1}$ represent each of said plurality of message groups segmented within said message, where S[ ] represents a syndrome operator, where p represents the bit quantity for each of said plurality of message groups, and where M(x) represents said message.

42. The apparatus in accordance with claim 41 wherein said CRC lookup table is stored utilizing random access memory (RAM).

43. The apparatus in accordance with claim 41 wherein said CRC lookup table is stored utilizing read only memory (ROM).

44. The apparatus in accordance with claim 41 wherein said CRC lookup table is stored utilizing programmable read only memory (PROM).

45. The apparatus in accordance with claim 41 wherein said CRC lookup table is stored utilizing electrically programmable read only memory (EPROM).

46. The apparatus in accordance with claim 41 wherein said remainder and said new remainder are sequentially stored in temporary memory, said temporary memory implemented utilizing random access memory (RAM).

47. The apparatus in accordance with claim 41 wherein said remainder and said new remainder are sequentially stored in temporary memory, said temporary memory implemented utilizing a bubble memory device.

48. The apparatus in accordance with claim 41 wherein said remainder and said new remainder are sequentially stored in temporary memory, said temporary memory implemented utilizing at least one shift register.

49. The apparatus in accordance with claim 41 wherein said CRC lookup table is implemented utilizing a Reduced Table lookup algorithm.

* * * * *